(12) United States Patent
Layer et al.

(10) Patent No.: US 10,969,418 B2
(45) Date of Patent: Apr. 6, 2021

(54) REFLECTOMETRY SYSTEM FOR ANALYSING DEFECTS IN AT LEAST ONE TRANSMISSION LINE, THE SYSTEM COMPRISING A COMPLEX CORRELATOR

(71) Applicant: COMMISSARIAT A L'ENERGIE ATOMIQUE ET AUX ENERGIES ALTERNATIVES, Paris (FR)

(72) Inventors: Christophe Layer, Paris (FR); Esteban Cabanillas, Orsay (FR); Mickael Cartron, Orsay (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/634,511

(22) PCT Filed: Jul. 18, 2018

(86) PCT No.: PCT/EP2018/069468
§ 371 (c)(1),
(2) Date: Jan. 27, 2020

(87) PCT Pub. No.: WO2019/020448
PCT Pub. Date: Jan. 31, 2019

(65) Prior Publication Data
US 2020/0166560 A1 May 28, 2020

(30) Foreign Application Priority Data

Jul. 28, 2017 (FR) ...................................... 1757181

(51) Int. Cl.
*G01R 31/11* (2006.01)
*G01R 31/08* (2020.01)

(52) U.S. Cl.
CPC ............. *G01R 31/11* (2013.01); *G01R 31/083* (2013.01); *G01R 31/085* (2013.01); *G01R 31/086* (2013.01); *G01R 31/088* (2013.01)

(58) Field of Classification Search
CPC .... G01R 31/11; G01R 31/083; G01R 31/085; G01R 31/086; G01R 31/088; G01R 31/08; G01R 31/081
(Continued)

(56) References Cited

U.S. PATENT DOCUMENTS

| 5,787,128 A | 7/1998 | Honkisz |
| 2004/0183544 A1* | 9/2004 | Allan ..................... G01R 31/58 324/533 |

(Continued)

FOREIGN PATENT DOCUMENTS

FR 3 006 769 A1 12/2014

*Primary Examiner* — Farhana A Hoque
(74) *Attorney, Agent, or Firm* — BakerHostetler

(57) ABSTRACT

A reflectometry system includes at least one measurement means for measuring a reference signal retro-propagated in at least one transmission line, at least one analog-digital converter for converting at least one measured signal into a set of at least one first digital signal and one second digital signal, at least one complex correlator configured to correlate the real reference signal with a complex signal whose real part is formed by a first digital signal of the set and whose imaginary part is formed by a second digital signal of the set, so as to produce a first reflectogram corresponding to the real part of the complex signal and a second reflectogram corresponding to the imaginary part of the complex signal, an analysis module for analyzing at least the first reflectogram and the second reflectogram so as to identify the presence of defects in at least one transmission line.

10 Claims, 8 Drawing Sheets

(58) Field of Classification Search
USPC .......................................... 324/533; 702/59
See application file for complete search history.

(56) References Cited

U.S. PATENT DOCUMENTS

2010/0073014 A1   3/2010   Maslen
2010/0188095 A1   7/2010   Maslen

* cited by examiner

REFLECTOMETRY SYSTEM FOR ANALYSING DEFECTS IN AT LEAST ONE TRANSMISSION LINE, THE SYSTEM COMPRISING A COMPLEX CORRELATOR

CROSS-REFERENCE TO RELATED APPLICATIONS

This application is a National Stage of International patent application PCT/EP2018/069468, filed on Jul. 18, 2018, which claims priority to foreign French patent application No. FR 1757181, filed on Jul. 28, 2017, the disclosures of which are incorporated by reference in their entirety.

FIELD OF THE INVENTION

The invention relates to the field of wired-diagnosis systems based on the principle of reflectometry. It relates more precisely to such a system comprising a correlation device configured to carry out simultaneously two correlations of a reference signal respectively with two distinct reflectometry measurements. Such a device is used to increase the processing capabilities of the system, for example the number of transmission lines monitored in parallel or the speed of processing of the signals received by the system.

BACKGROUND

Cables are ubiquitous in all electrical systems, for power supply or transmission of information. These cables are subject to the same constraints as the systems that they link and can be prone to failures. It is therefore necessary to be able to analyze their state and to provide information on the detection of defects, but also their location and their type, so as to aid maintenance. The usual reflectometry methods allow tests of this type.

Reflectometry methods use a principle much like that of radar: an electrical signal, the probe signal or reference signal, which is usually of high frequency or broadband, is injected at one or more places in the cable to be tested. The signal propagates in the cable or the network and returns part of its energy when it encounters an electrical discontinuity. An electrical discontinuity can be the result, for example, of a branch-off, of the end of the cable or of a defect or more generally of a break in the signal propagation conditions in the cable. It results from a defect which locally modifies the characteristic impedance of the cable by causing a discontinuity in its lineal parameters.

The analysis of the signals returned at the injection point makes it possible to deduce therefrom information on the presence and the location of these discontinuities, therefore possible defects. An analysis in the time domain or frequency domain is customarily carried out. These methods are designated by the acronyms TDR from the expression "Time Domain Reflectometry" and FDR from the expression "Frequency Domain Reflectometry".

The invention enters the field of application of wired-diagnosis methods and applies to any type of electrical cable, especially energy transmission cables or communication cables, in fixed or mobile installations. The cables concerned can be coaxial, bifilar, in parallel lines, in twisted pairs or other, provided it is possible to inject a reflectometry signal thereinto at a point of the cable and to measure its reflection at the same point or at another point.

A reflectometry system is customarily used to diagnose the state of health of a transmission line, for example a single cable, by connecting the system at a point of the cable. However, in the case of complex installations, for example of a network of energy transmission, of power supply or of communication cables, in a building or a vehicle, for example an aircraft, the cables can be grouped into cable bundles. To analyze each cable of a bundle, it is then necessary to connect the system successively to each of the cables. Such a procedure gives rise to a processing time which can be crippling in particular when the time for access to the installations is limited. For example, for the case of a vehicle, such as an aircraft, the analysis time for the cables on board the vehicle impacts the overall time during which the vehicle may not be used. Moreover, when involved with detecting intermittent defects, that is to say of short duration, arising on several cables simultaneously, the use of a single diagnosis apparatus does not allow sufficiently fast analysis. Indeed, in such a scenario, the diagnosis apparatus is associated with a switching system to connect the apparatus successively to the various cables. The temporal switching thus carried out affects the capability to detect defects whose duration is short with respect to the switching time proportional to the number of cables to be diagnosed.

Another problem is related to the processing capabilities of a reflectometry system. In general, such a system comprises a digital-analog converter for converting the digital reference signal into an analog signal so as to inject it into the cable, an analog-digital converter to carry out the inverse operation on the measured signal and a correlator which carries out the calculation of the inter-correlation between the reference signal and the measured signal. The correlator can be implemented on a processor or on an integrated circuit of the ASIC or FPGA type. On account of technological limitations, the processing frequency or clock frequency of the device which implements the correlation function is generally lower than the sampling frequency of the analog-digital converter. Indeed, the inter-correlation calculation operation requires a significant number of operations and the modules for digital calculation (be they implemented via a digital processor or an integrated circuit) are not generally capable of operating at frequencies as high as an analog-digital converter. Therefore, it is not possible to process the signal at the output of the analog-digital converter at the speed at which it is received.

There therefore exists a general problem consisting in increasing the processing capabilities of a reflectometry system so as to make it possible to process several transmission lines simultaneously but also so as to allow calculation of the correlation function at a rate close or equal to the sampling frequency of the received signal.

SUMMARY OF THE INVENTION

The invention proposes a reflectometry system comprising one or more complex correlators whose two correlation pathways, corresponding respectively to the real part and to the imaginary part of the complex signal, are exploited so as to solve the technical problems introduced hereinabove.

Thus, the subject of the invention is a reflectometry system for the analysis of defects in a group of transmission lines comprising at least one line, a generated real reference signal being injected into each transmission line of said group, said system comprising:

at least one measurement means for measuring the reference signal retro-propagated in each transmission line of said group, at least one analog-digital converter for converting at least one measured signal into a set of at least one first digital signal and one second digital signal, at least one complex correlator configured to correlate the real reference signal with a complex signal whose real part is formed by a first digital signal of said set and whose imaginary part is formed by a second digital signal of said set, so as to produce a first reflectogram corresponding to the real part of the complex signal and a second reflectogram corresponding to the imaginary part of the complex signal, An analysis module for analyzing at least the first reflectogram and the second reflectogram to identify the presence of defects in at least one transmission line of said group.

According to a particular aspect of the invention, a complex correlator comprises a first Fourier transform module able to receive on an input the reference signal and whose second input is set to zero, a second Fourier transform module able to receive the first digital signal on a first input and the second digital signal on a second input, a multiplier designed to multiply a complex signal delivered as output of the first Fourier transform module with a complex signal delivered as output of the second Fourier transform module, and an inverse Fourier transform module designed to receive the complex signal delivered as output of the multiplier and provide as output the first reflectogram on a real pathway and the second reflectogram on an imaginary pathway.

According to a particular embodiment of the invention, said group of transmission lines comprises two transmission lines, said system comprising two analog-digital converters, the first digital signal and the second digital signal corresponding to the two respective transmission lines.

According to another particular embodiment of the invention, said group of transmission lines comprises a single line, said system comprising a single analog-digital converter, a device for decomposing a signal into several signals, with one input and an even number N of outputs, which is configured to receive the converted digital signal and to deliver, on each output, an undersampled, by a factor N, version of the input signal, and a multiplexer, with N inputs and one output, each input of which is linked to a respective output of a complex correlator, the multiplexer being configured to produce as output a single reflectogram on the basis of at least the first reflectogram and the second reflectogram, said system comprising a number N/2 of complex correlators.

According to another particular embodiment of the invention, the device for decomposing a signal into several signals is configured to transmit each new sample received as input to a new output of index incremented by one modulo N, and the multiplexer is configured to deliver as output, at each new instant, a new sample received on a new input of index incremented by one modulo N at each new instant.

According to a particular aspect of the invention, the sampling frequency of the analog-digital converter is substantially equal to N times the sampling frequency of the signal injected into the line and the processing frequency of the complex correlator(s) is greater than or equal to the sampling frequency of the signal injected into the line and strictly lower than the sampling frequency of the analog-digital converter.

According to a particular aspect of the invention, the device for decomposing a signal into several signals is configured to, transmit each new block of samples received as input to a new output of index incremented by one modulo N and the multiplexer is configured to deliver as output, at each new instant, a new block of samples received on a new input of index incremented by one modulo N at each new instant, the system furthermore comprising a number N of input FIFO memories each being connected between a distinct output of the device for decomposing a signal into several signals and a distinct input of a distinct complex correlator, the system also comprising a number N of output FIFO memories each being connected between a distinct output of a distinct complex correlator and a distinct input of the multiplexer.

According to a particular aspect of the invention, the reference signal is periodic and the number of samples per block is equal to the number of samples per period of the reference signal.

According to a particular aspect of the invention, the sampling frequency of the analog-digital converter is substantially equal to the sampling frequency of the signal injected into the line and the processing frequency of the complex correlator(s) is at least equal to the sampling frequency of the analog-digital converter divided by N and strictly lower than the sampling frequency of the analog-digital converter, divided by N−2 if N is different from two.

According to a particular variant, the reflectometry system according to the invention comprises a generator of the reference signal, at least one digital-analog converter and at least one injection device for injecting the analog reference signal into each transmission line of said group.

BRIEF DESCRIPTION OF THE DRAWINGS

Other characteristics and advantages of the present invention will become better apparent on reading the description which follows in relation to the appended drawings which represent.

DETAILED DESCRIPTION

Figure 1:
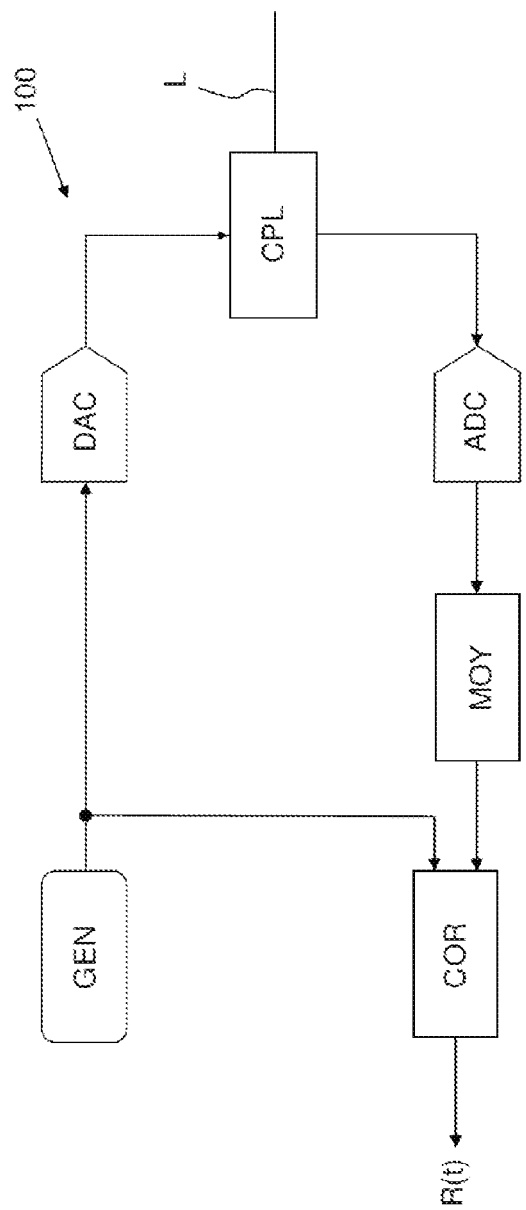
FIG. 1, a diagram of a reflectometry system according to the prior art.

FIG. 1 represents a diagram of a system 100 for defect analysis in a transmission line L, such as a cable, according to a usual time reflectometry method of the prior art. Such a system mainly comprises a generator GEN of a reference signal. The digital reference signal generated is converted analogically via a digital-analog converter DAC and is then injected at a point of the transmission line L by means of a directional coupler CPL or any other device making it possible to inject a signal into a line. The signal propagates along the line and reflects on the singularities that the line comprises. In the absence of any defect on the line, the signal reflects on the end of the line if the termination of the line is not suitably matched. In the presence of a defect on the line, the signal reflects on the impedance discontinuity caused by the defect. The reflected signal is retro-propagated up to a measurement point, which can be common to the injection point or different. The retro-propagated signal is measured via the directional coupler CPL and then converted digitally by an analog-digital converter ADC. A correlation COR is thereafter performed between the measured digital signal and a copy of the digital signal generated before injection so as to produce a time reflectogram R(t) corresponding to the inter-correlation between the two signals.

As is known in the field of diagnosis methods based on time reflectometry, the position $d_{DF}$ of a defect on the cable L, stated otherwise its distance from the signal injection point, can be obtained directly on the basis of the measurement, on the time reflectogram calculated R(t), of the duration $t_{DF}$ between the first amplitude peak plotted on the reflectogram and the amplitude peak corresponding to the signature of the defect.

Figure 1A:
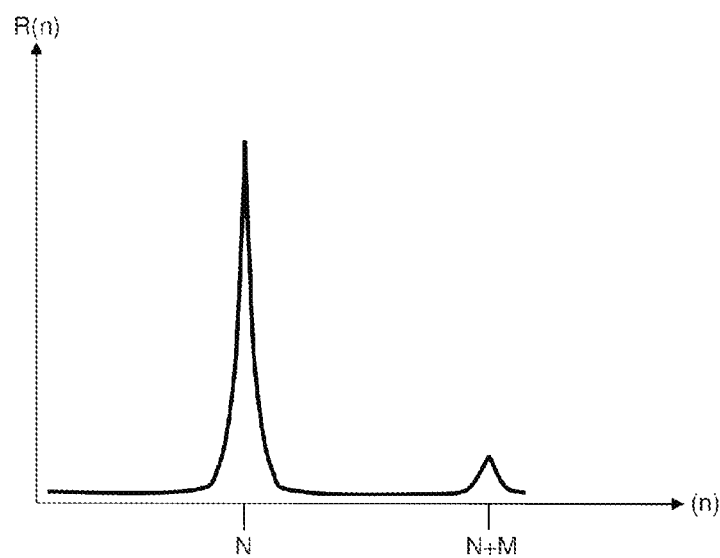
FIG. 1a, an exemplary reflectogram obtained with the reflectometry system of FIG. 1, FIG. 2, a diagram of a correlator used in a reflectometry system of the type described in FIG. 1, FIG. 3, a diagram of a correlator used in a reflectometry system modified according to the invention, FIG. 4, a diagram of a reflectometry system according to a first embodiment of the invention, FIG. 5a, a diagram of a reflectometry system according to a second embodiment of the invention, FIG. 5b, a variant of the system according to the second embodiment of the invention, FIG. 6a, a diagram of a reflectometry system according to a third embodiment of the invention, FIG. 6b, a variant of the system according to the third embodiment of the invention.

FIG. 1a represents an exemplary reflectogram R(n) obtained with the aid of the system of FIG. 1, on which are observed a first amplitude peak at an abscissa N and a second amplitude peak at an abscissa N+M. The first amplitude peak corresponds to the reflection of the signal at the point of injection into the cable, while the second peak corresponds to the reflection of the signal on an impedance discontinuity caused by a defect.

Various known methods are conceivable for determining the position $d_{DF}$. A first method consists in applying the relation connecting distance and time: $d_{DF}=V_g \cdot t_{DF}/2$ where $V_g$ is the signal propagation speed in the cable. Another possible method consists in applying a proportionality relation of the type $d_{DF}/t_{DF}=L_c/t_0$ where $L_c$ is the length of the cable and to is the duration, measured on the reflectogram, between the amplitude peak corresponding to the impedance discontinuity at the injection point and the amplitude peak corresponding to the reflection of the signal on the end of the cable. In order to decrease the level of the measurement noise, an optional calculation of average MOY can be carried out before or after correlation COR. The two sites of the average calculation are equivalent from an arithmetical point of view.

An analysis device (not represented in FIG. 1) is tasked with analyzing the reflectogram R(t) to deduce therefrom information in respect of presence and/or location of defects as well as the possible electrical characteristics of the defects.

Without departing from the scope of the invention, the emission and reception parts of the system described in FIG. 1 can be implemented in one and the same device or in two distinct devices. The emission part of the system comprises the signal generator, the digital-analog converter and the device for injecting the signal into a cable. The reception part of the system comprises the device for measuring the signal retro-propagated in the cable and the digital calculation modules comprising the calculation of average and of inter-correlation.

Figure 2:
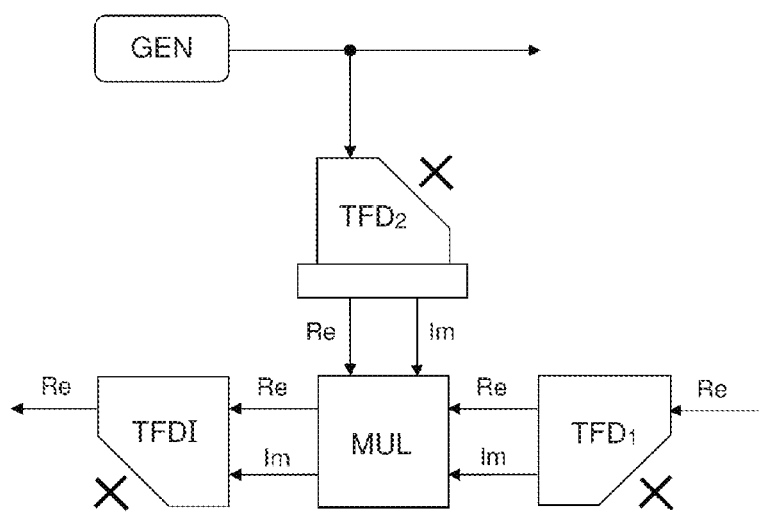

The correlator COR of a reflectometry system can advantageously be implemented in the form described in FIG. 2. According to this possible implementation, the correlator COR comprises a first module for discrete Fourier transform $TFD_1$ of the measured signal, a second module for discrete Fourier transform $TFD_2$ of the reference signal, a multiplier MUL to calculate the product of the above two results and then finally an inverse discrete Fourier transform TFDI module applied to the result of the product. This implementation results from the following formula expressing the inter-correlation of two signals x(t) and x'(t):

$$c(t) = \int_{-\infty}^{\infty} x'(t+\tau) \cdot x^*(\tau) d\tau = TF^{-1}\{TF\{x'(t)\} \cdot TF\{x^*(t)\}\},$$

TF designates the Fourier transform operation, while $TF^{-1}$ designates the inverse Fourier transform operation.

This relation ensues from the fact that the correlation operation in the time domain corresponds to a multiplication operation in the frequency domain.

The Fourier transform and inverse Fourier transform modules each comprise two inputs and two outputs corresponding respectively to the real and imaginary parts of a complex signal.

According to the implementation described in FIG. 2, the digitized signal at the output of the analog-digital converter ADC is produced on the real input of the first discrete Fourier transform module $TFD_1$ and the reference signal is produced on the real input of the second discrete Fourier transform module $TFD_2$. The result R(t) of the inter-correlation between the two signals is available on the real output of the inverse discrete Fourier transform module TFDI. The expression "real input/output" is employed here to designate the first input/output among the two inputs/outputs available, the second input/output being called the "imaginary input/output".

The invention is based on the mathematical property described hereinafter of the correlator described in FIG. 2. Denote by r(t) the reference signal generated and $s_1(t)$ and $s_2(t)$ two distinct signals produced respectively on the real input and the complex input of the first discrete Fourier transform module $TFD_1$ of the correlator COR. Denote by $\Gamma_{rs1}(t)$ and $\Gamma_{rs2}(t)$ the respective results of the inter-correlation between r(t) and $s_1(t)$ on the one hand and between r(t) and $s_2(t)$ on the other hand.

The correlation operation in the time domain corresponds to a product in the frequency domain. The following equivalences are thus derived:

$$\Gamma_{rs1}(t) = \int_T r(\tau) \cdot s^*_1(t+\tau) d\tau \Leftrightarrow \Gamma_{RS1}(f) = R(f) \cdot S_1(f)$$

$$\Gamma_{rs2}(t) = \int_T r(\tau) \cdot s^*_2(t+\tau) d\tau \Leftrightarrow \Gamma_{RS2}(f) = R(f) \cdot S_2(f)$$

R(f) is the result of the Fourier transform applied to r(t),
$S_1(f)$ is the result of the Fourier transform applied to $s_1(t)$,
$S_2(f)$ is the result of the Fourier transform applied to $s_2(t)$,
$\Gamma_{RS1}(f)$ is the result of the Fourier transform applied to $\Gamma_{rs1}(t)$,
$\Gamma_{RS2}(f)$ is the result of the Fourier transform applied to $\Gamma_{rs2}(t)$.

Thus, by transmitting the two signals $s_1(t)$ and $s_2(t)$ on the two inputs of the first discrete Fourier transform module $TFD_1$ of the correlator COR, we obtain at the output of the correlator a complex value given by the following relation:

$$\Gamma_{rs}(t) = \Gamma_{rs1}(t) + j \cdot \Gamma_{rs2}(t) = \int_T r(\tau) \cdot (s_1^* + j \cdot s_2^*)(t+\tau) d\tau$$

$$= \int_T r(\tau) \cdot s_1^*(t+\tau) d\tau + j \cdot \int_T r(\tau) \cdot s_2^*(t+\tau) d\tau$$

$$= TF^{-1}\{R(f) \cdot (S_1(f) + j \cdot S_2(f))\}$$

$$= TF^{-1}\{TF\{r(t)\} \cdot TF\{s_1(t) + j \cdot s_2(t)\}\}$$

$$= r(t) \star s_1(t) + j \cdot r(t) \star s_2(t)$$

Thus, it is clearly seen that the real and imaginary outputs of the correlator COR of FIG. 2 make it possible to deliver two independent correlation results corresponding respectively to the inter-correlation between the (real) reference signal and a first signal received on the real pathway of the first discrete Fourier transform module $TFD_1$ and the inter-correlation between the (real) reference signal and a second signal received on the imaginary pathway of the first discrete Fourier transform module $TFID_1$.

Figure 3:
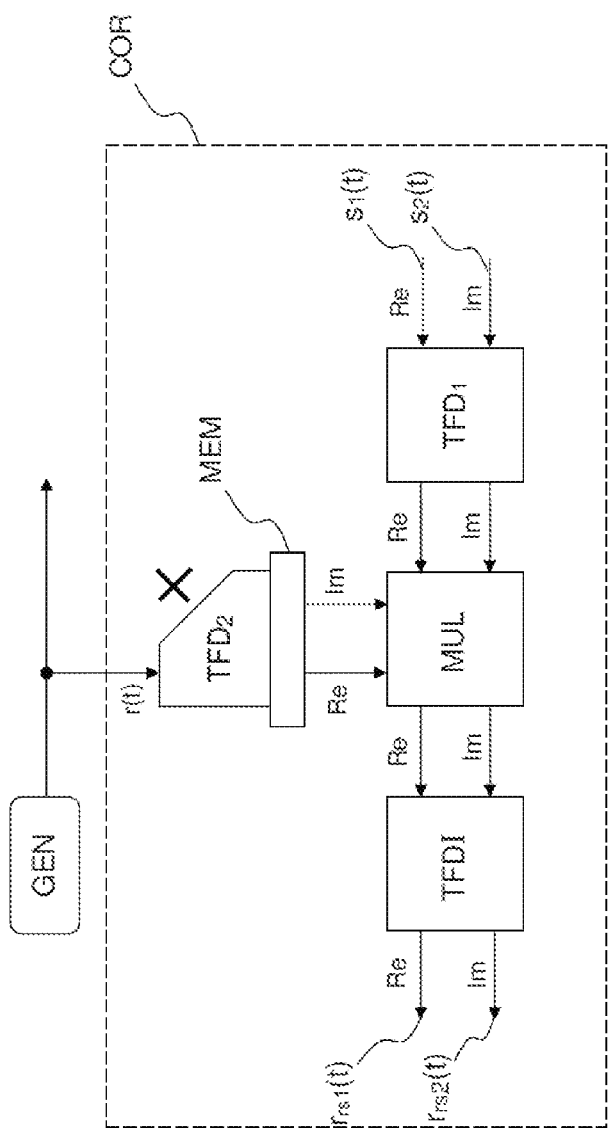

This principle is illustrated in FIG. 3 in which the same correlator COR is represented as in FIG. 2, but this time the two inputs of the first discrete Fourier transform module $TFD_1$ are supplied with two distinct signals and two independent inter-correlation results, associated with the two distinct signals, are provided on the two outputs of the inverse discrete Fourier transform module TFDI. It should be noted that the discrete Fourier transform $TFD_2$ calculation applied to the reference signal may be executed just once, initially, the result of the calculation being stored in a memory MEM so as to be used thereafter for several successive acquisitions of the measured signal.

The invention is based on the principle described hereinabove and uses a correlator configured according to the description given with FIG. 3 to increase the capabilities of a reflectometry system. Without departing from the scope of the invention, the correlator COR can be implemented by means of a different implementation, the independence of the correlation results on the two output pathways of the correlator existing irrespective of the implementation.

Figure 4:
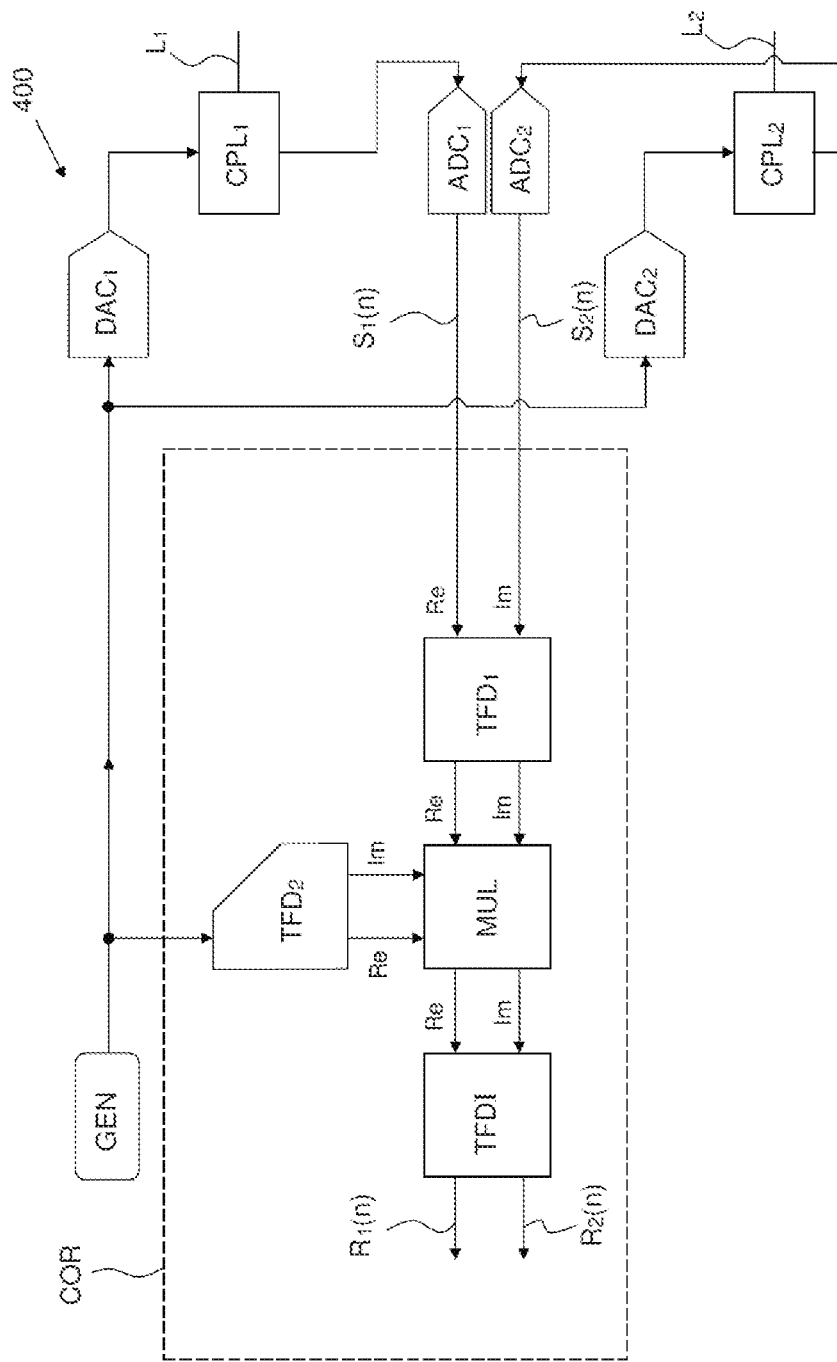

FIG. 4 represents a reflectometry system 400 according to a first embodiment of the invention.

The system 400 is suitable for carrying out, on the basis of a single piece of equipment, an analysis of defects on two distinct transmission lines $L_1, L_2$. These two lines belong, for example and as indicated previously, to a bundle comprising several lines or cables.

The system 400 comprises a digital reference signal generator GEN, two digital-analog converters $DAC_1, DAC_2$ and two directional couplers $CPL_1, CPL_2$ for injecting the reference signal into the two transmission lines $L_1, L_2$. Alternatively, a single digital-analog converter can be used and be associated with a device making it possible to relay the analog signal respectively to the two directional couplers $CPL_1, CPL_2$.

The system 400 also comprises two analog-digital converters $ADC_1, ADC_2$ which each receive the signals respectively measured on the two transmission lines. The measurement means can be embodied by a directional coupler or by any other device making it possible to tap off the retro-propagated signal at a point of a line.

The two digital signals $s_1(n)$, $s_2(n)$ obtained as output of the two analog-digital converters $ADC_1, ADC_2$ are thereafter produced on the two input pathways of the correlator COR. The two output pathways of the correlator COR produce two reflectograms $R_1(n)$ and $R_2(n)$ which correspond respectively to the two transmission lines $L_1, L_2$. As explained hereinabove, the correlator COR thus makes it possible to process two signals in parallel, thereby exhibiting the advantage of being able to simultaneously analyze two transmission lines of one and the same group of lines, thereby achieving a gain in processing time by a factor of two.

The first digital-analog converter $DAC_1$ and the second digital-analog converter $DAC_2$ may or may not be synchronized. In particular, a time shift may exist between the two converters. The same consideration applies to the two analog-digital converters $ADC_1, ADC_2$.

The system 400 described in FIG. 4 makes it possible to analyze the presence of defects on two cables in parallel and to be able to detect defects which impact the two cables simultaneously at the same place. The gain in processing time is significant since the number of cables to be tested within one and the same site can be very significant, typically of the order of several tens of cables.

Moreover, the system 400 also makes it possible to ascertain the effect of the coupling between two adjacent lines when one of the two is affected by a defect, in particular by an intermittent defect.

Figure 5A:
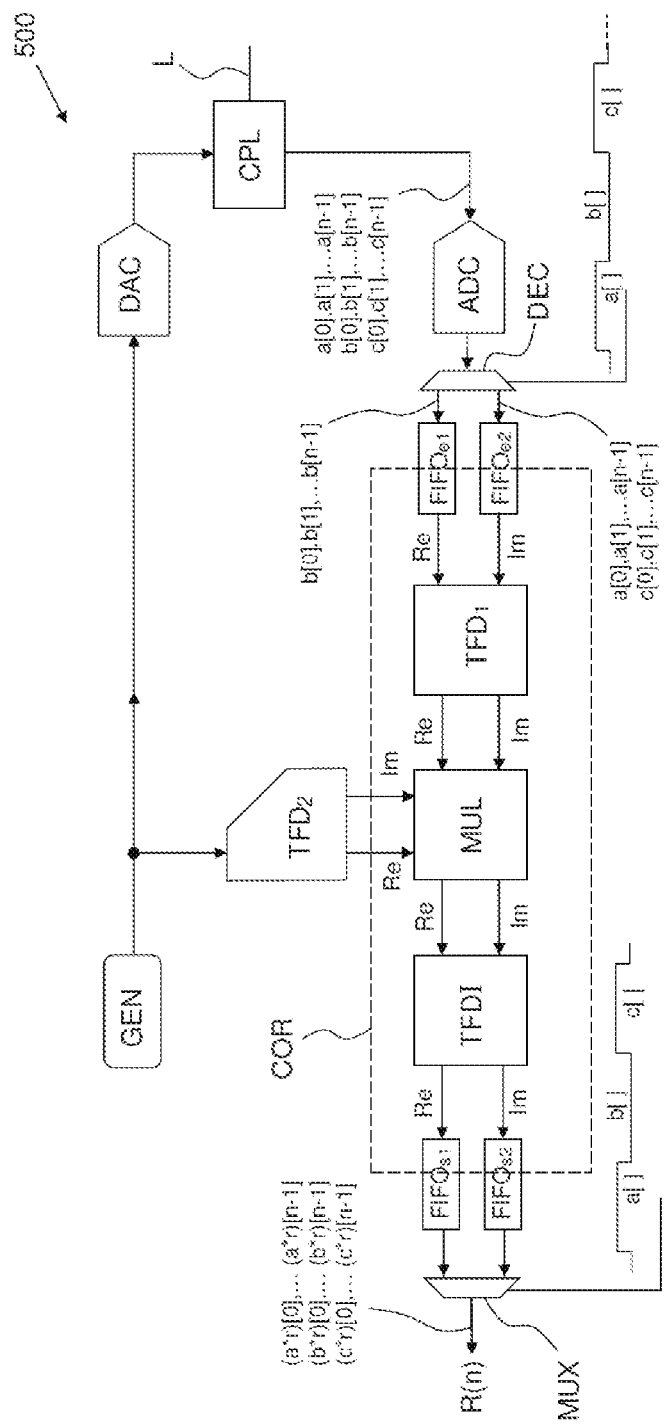

FIG. 5a represents a diagram of a reflectometry system 500 according to a second embodiment of the invention.

The system 500 is suitable for analyzing the defects present on a single transmission line L. It comprises the same components already introduced for the system described in FIG. 1. In this second embodiment, a case of application is considered for which the correlator COR is implemented on a processor or a circuit having a processing frequency $F_{cor}$ lower than the sampling frequency Fe of the analog-digital converter ADC. In this case of application, it is considered that the digital-analog converter DAC and the analog-digital converter ADC operate at the same sampling frequency. The processing frequency designates here the frequency at which the component which carries out the correlation function is capable of processing the samples of digital signal received as input and originating from the analog-digital converter ADC. This may be the clock frequency of the component. For example, the processing frequency $F_{cor}$ is at least equal to Fe/2 and strictly less than Fe. It should be noted that the system 500 can also operate if the processing frequency $F_{cor}$ is greater than or equal to the sampling frequency Fe, however such a case as this presents little interest since in this case, the output signal of the analog-digital converter ADC can be processed by a single pathway of the correlator COR.

In this case, the system described in FIG. 1 does not make it possible to calculate the correlation at the same rate as the rate of arrival of the samples.

To alleviate this problem, the system 500 uses the two input pathways of the correlator COR so as to be able to carry out the correlation calculation at the same rate as the rate of arrival of the samples.

Accordingly, the system 500 furthermore comprises a device DEC for decomposing the signal provided as output of the analog-digital converter ADC into two distinct signals produced on the two inputs of the correlator COR. It also comprises two input FIFO memories $FIFO_{e1}, FIFO_{e2}$ and two output FIFO memories $FIFO_{s1}, FIFO_{s2}$. It also comprises a multiplexer MUX.

The device DEC can be embodied by means of a switch, of a demultiplexer or of any equivalent component which makes it possible to steer the samples of the signal received at its input to one of its two outputs.

The signal generated by the generator GEN is a periodic signal. If n denotes the number of signal samples per period, then the device DEC is configured to alternatively transmit each successive block of n samples received on its input to one of the two outputs. For example, as indicated in FIG. 5a for the first three blocks of samples of size n received a,b,c, the first block a is dispatched on the second output, the second block b is dispatched on the first output and then the third block c is again dispatched on the second output and so on and so forth. The samples are transmitted successively to the input FIFO memories which store the blocks of n samples before transmitting them on each respective input pathway of the correlator COR. In this way, the correlation calculation is carried out over coherent periods of the measured signal.

The device DEC is driven by a signal for synchronous control of the duration of the blocks of samples of size n.

At the output of the correlator COR, the samples are also transmitted into output FIFO memories $FIFO_{s1}$, $FIFO_{s2}$ to store blocks of n samples which are thereafter multiplexed, by means of a multiplexer MUX, into a single recomposed signal which corresponds to the reflectogram of the signal measured on the line L, over several periods. The multiplexer MUX can be replaced with any equivalent component making it possible to recompose a unique signal from two signals received on two input pathways. The multiplexer MUX steers successively to its output, and alternatively, a block of n samples present in each of the two output FIFO memories. Stated otherwise, when a block of n samples is available in the first output FIFO memory $FIFO_{s1}$, this block is transmitted to the output, and then the following block is taken from the second output FIFO memory $FIFO_{s2}$, and then the following block is again taken from the first output FIFO memory $FIFO_{s1}$, and so on and so forth.

The multiplexer MUX is driven by a signal for synchronous selection of the duration of the blocks of samples of size n.

An input or output FIFO memory is dimensioned to allow continuous operation of the system.

The system 500 according to the second embodiment of the invention thus allows an acceleration of the correlation calculation by parallelizing the calculations by virtue of the two inputs of the complex correlator. Thus, it is possible to carry out the correlation calculation at a bitrate compatible with that of the analog-digital converter. This exhibits a considerable advantage with respect to the system 100 described in FIG. 1 when the processing frequency of the component embodying the correlator COR is strictly lower than the sampling frequency of the analog-digital converter. This particular case is commonplace since converters are mixed components which can operate at high frequencies by using specific technologies in contradistinction to components intended to carry out logical functions such as a signal processor or a digital circuit of FPGA or ASIC type.

Figure 5B:
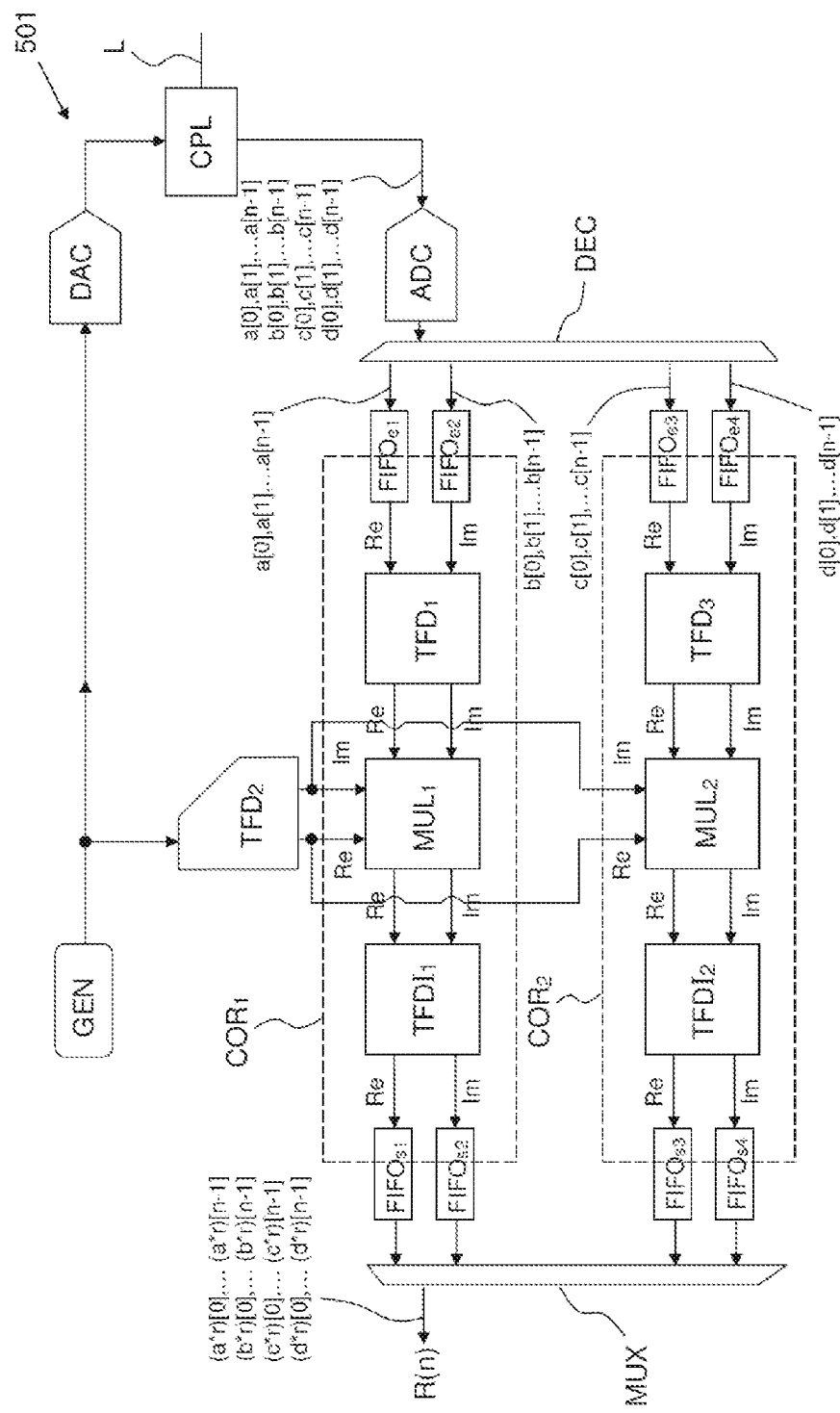

FIG. 5b represents a variant of the second embodiment of the system according to the invention.

The system 500 described in FIG. 5a can readily be extended for cases of application where the processing frequency $F_{cor}$ of the component which carries out the correlation is strictly less than Fe/2, where Fe is the sampling frequency of the analog-digital converter ADC. In this case, the system according to the invention is modified and comprises two correlators $COR_1$ and $COR_2$ which operate in parallel. The system 501 of FIG. 5b then comprises four input FIFO memories $FIFO_{e1}$, $FIFO_{e2}$, $FIFO_{e3}$, $FIFO_{e4}$ and four output FIFO memories $FIFO_{s1}$, $FIFO_{s2}$, $FIFO_{s3}$, $FIFO_{s4}$. The input signal decomposition device DEC is now configured to steer each new block of n samples received to a successive new output from among the four outputs of the device DEC. The operation of the device DEC for the first four blocks a,b,c,d of the received signal has been represented in the example of FIG. 5b, each block being steered to a respective output, this process being repeated for all the blocks of n samples of the received signal. Likewise, the multiplexer MUX comprises four inputs and is configured to recompose a single signal by successively steering each block of n samples available in each output FIFO memory to the output of the multiplexer. Thus, on each correlation pathway, the frequency of arrival of the samples is equal to Fe/4.

It is possible to generalize the example described in FIG. 5b to an arbitrary number, equal to N/2, of correlators, with N a strictly positive even integer number.

If the system comprises N/2 correlators COR, it comprises N input FIFO memories and N output FIFO memories, a device for decomposing the input signal with one input and N outputs and a multiplexer with N inputs and one output.

Such a system is suitable if the component or components carrying out the correlation calculations operate at a processing frequency $F_{cor}$ which is at least equal to Fe/N and strictly less than Fe/(N−2): Fe/N ≤ $F_{cor}$ < Fe/(N−2). Indeed, a correlator must operate at a processing frequency of at least equal to Fe/N which is the frequency of arrival of the samples at each output of the decomposition device DEC. If it operates at a frequency of greater than or equal to Fe/(N−2), then a correlator can be removed, since N/2−1 correlators suffice to be able to process the samples received at a processing frequency compatible with the sampling frequency of the analog-digital converter.

If a single correlator is used, that is to say if N=2 (case of FIG. 5a), then the processing frequency of the correlator satisfies the relation Fe/2 ≤ $F_{cor}$ < Fe.

Figure 6A:
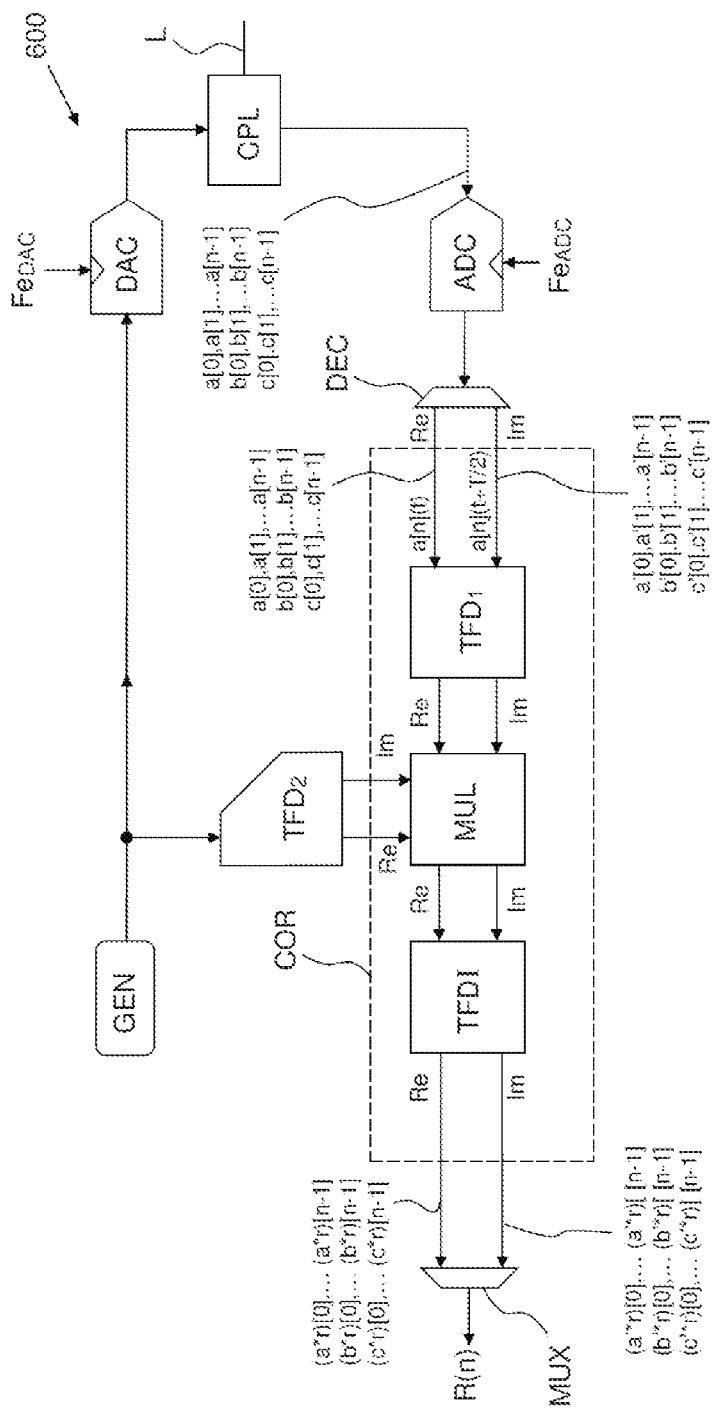

FIG. 6a represents a diagram of a reflectometry system 600 according to a third embodiment of the invention.

The system 600 is suitable for analyzing the defects present on a single transmission line L. It comprises the same components already introduced for the system described in FIG. 1.

This third embodiment is suitable in a case of application for which the sampling frequency $Fe_{ADC}$ of the analog-digital converter ADC is strictly greater than the sampling frequency $Fe_{DAC}$ of the digital-analog converter DAC, the ratio $Fe_{ADC}/Fe_{DAC}$ being equal to an integer number M strictly greater than 1. The processing frequency of the component which carries out the correlation COR is equal to the sampling frequency $Fe_{DAC}$ of the digital-analog converter DAC.

The system 600 comprises a device DEC for decomposing the signal at the output of the analog-digital converter ADC into two distinct signals and a multiplexer MUX for recomposing a single signal from the two signals produced on the two outputs of the correlator COR. The device DEC is linked by its two outputs to the two inputs of the correlator COR. The multiplexer MUX is linked by its two inputs to the two outputs of the correlator COR. The device DEC is driven by a control signal at the frequency $Fe_{ADC}$. The multiplexer MUX is driven by a selection signal at the frequency $Fe_{ADC}$.

In the example of FIG. 6a, the ratio $Fe_{ADC}/Fe_{DAC}$ is equal to two. Thus, the analog-digital converter ADC oversamples the signal by a factor of two with respect to the digital signal generated by the generator GEN.

The device DEC distributes a sample received on its input alternately on one and then the other of its outputs. Thus, on each of the two outputs of the device DEC is retrieved a signal at a sampling frequency equal to that of the digital-analog converter. Each of the two signals is time-shifted by T/2 with T=1/$Fe_{DAC}$, the sampling period of the signal generated.

The correlator COR calculates the inter-correlation of each of the two signals with a copy of the reference signal generated. On each of the two outputs of the correlator COR is retrieved an inter-correlation result which corresponds to a reflectogram of the signal at the sampling frequency $Fe_{DAC}$ but with a time shift of T/2.

The multiplexer MUX is configured to multiplex the two reflectograms so as to produce a single reflectogram R(n) which corresponds to the interleaving of the two reflectograms obtained at output of the correlator COR. The single reflectogram R(n) thus obtained exhibits a greater temporal resolution than that of a reflectogram calculated on the basis of a single signal at the sampling frequency $Fe_{DAC}$. It comprises one sample out of two originating from the signal received on the first input of the multiplexer MUX and one sample out of two originating from the signal received on the second input of the multiplexer MUX. Thus, the system 600 makes it possible to improve the precision of detection and of location of a defect appearing on the line L since the increase in the temporal resolution of the reflectogram gives rise directly to an increase in the spatial resolution for defect location along the line L. Thus, defects of small size can be better detected and located.

These advantages are obtained by virtue of the use of the two pathways of the correlator COR. Indeed, with the system described in FIG. 1, even if the sampling frequency $Fe_{ADC}$ of the analog-digital converter is higher than that of the digital-analog converter, the correlator cannot calculate the inter-correlation at the rate of arrival of the signal oversampled by a factor of two.

The system 600 can advantageously be implemented when the processing frequency of the correlator COR is at least equal to the sampling frequency $Fe_{DAC}$ of the signal generated and strictly lower than the sampling frequency $Fe_{ADC}$ of the analog-digital converter ADC and when the ratio $Fe_{ADC}/Fe_{DAC}$ is equal to 2.

Figure 6B:
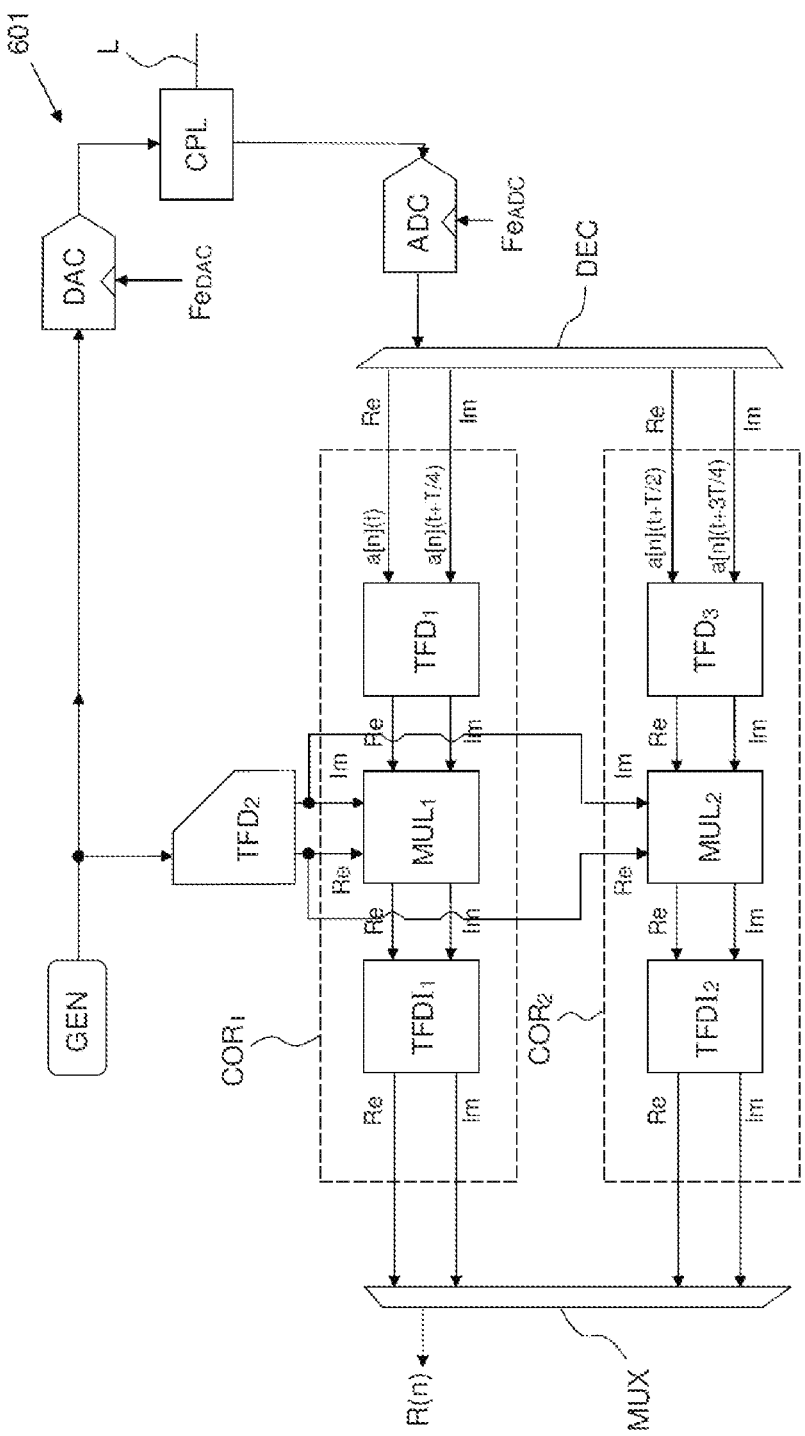

FIG. 6b describes a variant of the third embodiment of the invention, for which the ratio $Fe_{ADC}/Fe_{DAC}$ is equal to 4 and the processing frequency of a correlator $F_{COR}$ is still equal to the sampling frequency $Fe_{DAC}$ of the generated signal.

In this particular case, the system 601 according to the invention comprises two correlators $COR_1, COR_2$. The device DEC for decomposing the output signal of the converter ADC comprises an input and four outputs and is configured to successively steer each signal sample received on its input to a successive output. Stated otherwise, the first sample a[n](t) is transmitted to the first output, the second sample a[n](t+T/4) is transmitted to the second output, the third sample a[n](t+T/2) is transmitted to the third output, the fourth sample a[n](t+3T/4) is transmitted to the fourth output. This sequence being repeated so on and so forth. Stated otherwise, on each output of the device DEC is retrieved a signal at the sampling frequency $Fe_{DAC}$, shifted by T/4 with respect to the signal on the following output.

The first two outputs of the device DEC are linked to the two inputs of a first correlator $COR_1$. The last two outputs of the device DEC are linked to the two inputs of a second correlator $COR_2$.

The multiplexer MUX comprises four inputs and an output. Its first two inputs are linked to the two outputs of the first correlator $COR_1$ and its other two inputs are linked to the two outputs of the second correlator $COR_2$.

The multiplexer MUX is configured to interleave the four signals received so as to form a single reflectogram R(n) whose temporal resolution is four times greater than that obtained with the system of FIG. 1 operating under the same operating frequency conditions.

The system 601 can advantageously be implemented when the processing frequency of the component carrying out the correlators $COR_1, COR_2$ is at least equal to the sampling frequency $Fe_{DAC}$ of the signal generated and strictly lower than the sampling frequency $Fe_{ADC}$ of the analog-digital converter ADC and when the ratio $Fe_{ADC}/Fe_{DAC}$ is equal to 4.

It is possible to generalize the system 601 for cases of application where the processing frequency of the component embodying the correlators is at least equal to the sampling frequency $Fe_{DAC}$ of the signal generated and strictly lower than the sampling frequency $Fe_{ADC}$ of the analog-digital converter ADC and the ratio $Fe_{ADC}/Fe_{DAC}$ is equal to N, with N an even integer number, at least equal to 2.

In this case, the system according to the third embodiment of the invention comprises N/2 correlators operating in parallel. The device DEC for decomposing the signal received comprises an input and N outputs, each output being connected to a respective input of a respective correlator. The multiplexer MUX comprises N inputs and an output, each input being connected to a respective output of a respective correlator.

The device DEC is configured to steer each sample received as input successively to a different output, so as to produce on each output a signal which is undersampled by a factor N with respect to the input signal. Each of the signals produced at the output of the device DEC is time-shifted by a delay equal to T/N.

The multiplexer MUX is configured to interleave the N signals received on its N inputs so as to produce a single reflectogram R(n) whose temporal resolution is increased by a factor N with respect to the reflectogram which would be obtained using the system of FIG. 1.

The system according to any one of the variant embodiments of the invention can be implemented by an electronic card on which the various components are disposed. The card can be connected to the cable(s) to be analyzed by one or more coupling means CPL which can take the form of a directional coupler with capacitive or inductive effect or else an ohmic connection. A coupling device can be embodied by physical connectors which link the signal generator to the cable or by contactless means, for example by using a metallic cylinder whose internal diameter is substantially equal to the external diameter of the cable and which produces an effect of capacitive coupling with the cable.

Furthermore, a processing unit, of computer, personal digital assistant type or other equivalent electronic or computing device can be used to drive the system according to the invention and display the results of the calculations performed by the correlator or correlators on a man-machine interface, in particular the reflectogram R(n) and/or the information in respect of detection and location of defects on the cable.

The process according to the invention, in particular the correlation calculation modules, can be implemented in an embedded or non-embedded processor or in a specific device. The processor can be a generic processor, a specific processor, an integrated circuit specific to an application (also known by the English name ASIC for "Application-Specific Integrated Circuit") or a network of in situ programmable gates (also known by the English name FPGA for "Field-Programmable Gate Array"). The device according to the invention can use one or more dedicated electronic circuits or a general-purpose circuit. The technique of the invention can be carried out on a reprogrammable calculation machine (a processor or a micro-controller for example) executing a program comprising a sequence of instructions, or on a dedicated calculation machine (for example a set of logic gates such as an FPGA or an ASIC, or any other hardware module).

The reflectometry system according to the invention can comprise, within one and the same device, at one and the same time the components able to generate the reference signal and to inject it into one or more transmission line(s) and the components able to measure the retro-propagated signal and to carry out the calculations required to compute a reflectogram. Alternatively, these two parts can be implemented on two distinct devices, each device being connected independently to the cable to be analyzed.

The invention claimed is:

1. A reflectometry system for the analysis of defects in a group of transmission lines comprising at least one line (L,$L_1$,$L_2$), a generated real reference signal being injected into each transmission line (L,$L_1$,$L_2$) of said group, said system comprising:
   at least one measurement means (CPL,$CPL_1$,$CPL_2$) for measuring the reference signal retro-propagated in each transmission line (L,$L_1$,$L_2$) of said group,
   at least one analog-digital converter (ADC,$ADC_1$,$ADC_2$) for converting at least one measured signal into a set of at least one first digital signal and one second digital signal,
   at least one complex correlator (COR,$COR_1$,$COR_2$) configured to correlate the real reference signal with a complex signal whose real part is formed by a first digital signal of said set and whose imaginary part is formed by a second digital signal of said set, so as to produce a first reflectogram corresponding to the real part of the complex signal and a second reflectogram corresponding to the imaginary part of the complex signal,
   an analysis module for analyzing at least the first reflectogram and the second reflectogram so as to identify the presence of defects in at least one transmission line of said group.

2. The reflectometry system as claimed in claim 1, wherein a complex correlator (COR,$COR_1$,$COR_2$) comprises a first Fourier transform module ($TFD_2$) able to receive on an input the reference signal and whose second input is set to zero, a second Fourier transform module ($TFD_1$) able to receive the first digital signal on a first input and the second digital signal on a second input, a multiplier (MUL) designed to multiply a complex signal delivered as output of the first Fourier transform module ($TFD_2$) with a complex signal delivered as output of the second Fourier transform module ($TFD_1$), and an inverse Fourier transform module (TFDI) designed to receive the complex signal delivered as output of the multiplier (MUL) and provide as output the first reflectogram on a real pathway and the second reflectogram on an imaginary pathway.

3. The reflectometry system as claimed in claim 1, wherein said group of transmission lines comprises two transmission lines ($L_1$,$L_2$), said system comprising two analog-digital converters ($ADC_1$,$ADC_2$), the first digital signal and the second digital signal corresponding to the two respective transmission lines ($L_1$,$L_2$).

4. The reflectometry system as claimed in claim 1, wherein said group of transmission lines comprises a single line (L), said system comprising a single analog-digital converter (ADC), a device (DEC) for decomposing a signal into several signals, with one input and an even number N of outputs, which is configured to receive the converted digital signal and to deliver, on each output, an undersampled, by a factor N, version of the input signal, and a multiplexer (MUX), with N inputs and one output, each input of which is linked to a respective output of a complex correlator, the multiplexer (MUX) being configured to produce as output a single reflectogram on the basis of at least the first reflectogram and the second reflectogram, said system comprising a number N/2 of complex correlators.

5. The reflectometry system as claimed in claim 4, wherein the device (DEC) for decomposing a signal into several signals is configured to transmit each new sample received as input to a new output of index incremented by one modulo N, and the multiplexer (MUX) is configured to deliver as output, at each new instant, a new sample received on a new input of index incremented by one modulo N at each new instant.

6. The reflectometry system as claimed in claim 4, wherein the sampling frequency ($Fe_{ADC}$) of the analog-digital converter is substantially equal to N times the sampling frequency ($Fe_{DAC}$) of the signal injected into the line and the processing frequency ($F_{cor}$) of the complex correlator(s) (COR,$COR_1$,$COR_2$) is greater than or equal to the sampling frequency ($Fe_{DAC}$) of the signal injected into the line and strictly lower than the sampling frequency of the analog-digital converter ($Fe_{ADC}$).

7. The reflectometry system as claimed in claim 4, wherein the device (DEC) for decomposing a signal into several signals is configured to, transmit each new block of samples received as input to a new output of index incremented by one modulo N and the multiplexer (MUX) is configured to deliver as output, at each new instant, a new block of samples received on a new input of index incremented by one modulo N at each new instant, the system furthermore comprising a number N of input FIFO memories ($FIFO_{e1}$,$FIFO_{e2}$) each being connected between a distinct output of the device (DEC) for decomposing a signal into several signals and a distinct input of a distinct complex correlator (COR), the system also comprising a number N of output FIFO memories ($FIFO_{s1}$,$FIFO_{s2}$) each being connected between a distinct output of a distinct complex correlator (COR) and a distinct input of the multiplexer (MUX).

8. The reflectometry system as claimed in claim 6, wherein the reference signal is periodic and the number of samples per block is equal to the number of samples per period of the reference signal.

9. The reflectometry system as claimed in claim 4, wherein the sampling frequency of the analog-digital converter ($Fe_{ADC}$) is substantially equal to the sampling frequency ($Fe_{DAC}$) of the signal injected into the line and the processing frequency ($F_{cor}$) of the complex correlator(s) (COR,$COR_1$,$COR_2$) is at least equal to the sampling frequency of the analog-digital converter ($Fe_{ADC}$) divided by N and strictly lower than the sampling frequency of the analog-digital converter ($Fe_{ADC}$), divided by (N−2) if N is different from two.

10. The reflectometry system as claimed in claim 1, comprising a generator of the reference signal (GEN), at least one digital-analog converter (DAC) and at least one injection device (CPL,$CPL_1$,$CPL_2$) for injecting the analog reference signal into each transmission line (L,$L_1$,$L_2$) of said group.

* * * * *